US007853229B2

(12) United States Patent
Maulik et al.

(10) Patent No.: US 7,853,229 B2
(45) Date of Patent: Dec. 14, 2010

(54) METHODS AND APPARATUS FOR CALIBRATION OF AUTOMATIC GAIN CONTROL IN BROADCAST TUNERS

(75) Inventors: Prabir C. Maulik, Lexington, MA (US);
Steven Rose, Reading, MA (US);
Donald Paterson, Winchester, MA (US);
Hassan L'Bahy, Leominster, MA (US);
Nazmy Abaskharoun, Somerville, MA (US)

(73) Assignee: Analog Devices, Inc., Norwood, MA (US)

( * ) Notice: Subject to any disclaimer, the term of this patent is extended or adjusted under 35 U.S.C. 154(b) by 616 days.

(21) Appl. No.: 11/890,858

(22) Filed: Aug. 8, 2007

(65) Prior Publication Data

US 2009/0042526 A1 Feb. 12, 2009

(51) Int. Cl.
*H04B 7/00* (2006.01)
(52) U.S. Cl. .................... 455/234.1; 455/254
(58) Field of Classification Search ............. 455/226.1, 455/226.2, 232.1, 254, 296.1, 307, 310, 234.1, 455/239.1; 375/343, 344, 345, 357
See application file for complete search history.

(56) References Cited

U.S. PATENT DOCUMENTS 7,091,792 B2  8/2006  Mehr
2002/0142745 A1* 10/2002  Kang et al. ............. 455/234.1

(Continued)

FOREIGN PATENT DOCUMENTS

EP   1 724 953 A   11/2006

OTHER PUBLICATIONS

International Preliminary Report on Patentability in corresponding International Application No. PCT/US2008/009455, dated Feb. 9, 2010.

(Continued)

*Primary Examiner*—Thanh C Le
(74) *Attorney, Agent, or Firm*—Knobbe, Martens, Olson & Bear LLP

(57) ABSTRACT

In one aspect, a calibration component configured to calibrate an automatic gain controller (AGC) for use in a tuner configured to isolate a selected channel from a multi-channel broadcast signal, the tuner implemented substantially on two chips, a first chip comprising a radio frequency (RF) integrated circuit adapted for RF processing and a second chip comprising a digital integrated circuit adapted for digital processing is provided. The calibration component comprises a calibration signal generator implemented on the RF integrated circuit, the calibration signal generator adapted to generate a generally known calibration signal, a power detector implemented on the RF integrated circuit and configured to detect, during calibration, at least one power characteristic of the calibration signal and to provide a power level signal indicative of the at least one detected power characteristic, a gain controller implemented on the digital integrated circuit, the gain controller adapted to generate at least one error signal based, at least in part, on a comparison between the power level signal provided by the power detector and a first reference signal, an offset signal generator implemented on the RF integrated circuit and configured to generate an offset signal based, at least in part, on the at least one error signal and a summing element implemented on the RF integrated circuit and adapted to combine the offset signal with the power level signal provided by the power detector to provide an adjusted power level signal.

37 Claims, 8 Drawing Sheets

U.S. PATENT DOCUMENTS

2003/0012313 A1* 1/2003 Husted et al. ............... 375/345
2006/0166633 A1 7/2006 Mehr
2006/0264192 A1* 11/2006 Kuo et al. ................ 455/232.1

OTHER PUBLICATIONS

B-E. Kim et al., "A 9dBm IIP3 Direct-Conversion Satellite Broadband Tuner-Demodulator SOC," *2003, Digest of Technical Papers, ISS CC. 2003, IEEE International Solid-State Circuits Conference*, San Francisco, CA Feb. 9-13, 2003, Piscataway, NJ, IEEE, US. Feb. 9, 2003, pp. 1-10.

S. Drude, and M. Klecha, "System Aspects for Broadcast TV Reception in Mobile Phones," *Consumer Electronics, 2006. ICCE '06. 2006 Digest of Technical Papers*, pp. 269-270.

S. Amiot, G. Bassement, A. Daubenfeld, V. Fillatre, E. Maurice, F. Mercier, T. Mevel, Y. Richard and J-R Tourret, "A Low Power DVB-T/H Zero-IF Tuner IC Design in 0.25 µm BiCMOS Technology for Mobile TV Reception," *IEEE Transactions on Broadcasting*, IEEE Service Center, Piscataway, NJ, vol. 53, No. 1, Mar. 1, 2007, pp. 434-440.

International Search Report and Written Opinion for International Application No. PCT/US2008/009455, mailed Nov. 27, 2008.

* cited by examiner

METHODS AND APPARATUS FOR CALIBRATION OF AUTOMATIC GAIN CONTROL IN BROADCAST TUNERS

FIELD OF THE INVENTION

The present invention relates to tuners and, more particularly, to automatic gain control in a pre-amplification phase of a television tuner.

BACKGROUND OF THE INVENTION

Information signals, and in particular television signals, are often transmitted either via a cable connected to a set-top box, or via terrestrial broadcast received by an antenna or satellite dish. In each case, the signals are typically formed of a number of distinct information components transmitted in designated frequency channels. Such a multi-channel signal is referred to herein as a "broadcast signal." Information in the broadcast signal may be processed by a tuner to, inter alia, extract one or more desired channels from the broadcast signal. For example, the broadcast signal may include signals across the television signal spectrum including the very high frequency (VHF) band (i.e., television carrier frequencies of 54-216 MHz) and the ultra high frequency (UHF) band (i.e., television carrier frequencies of 470-890 MHz). The broadcast signal may also include other channel frequencies outside these frequency bands (e.g., cable broadcast signals may include, in addition to the VHF and UHF bands, other designated signal carrier frequency bands).

In general, the various frequency bands comprise a number of different channels. For example, the VHF band is divided into 12 channels (channels 2-13) and the UHF band is divided into 70 channels (channels 14-83). Each channel is allocated a certain bandwidth in the broadcast spectrum depending on the standard by which the broadcast signal is transmitted. For example, the U.S. standard allocates a 6 MHz bandwidth for each channel and specifies where in that channel video and audio information components of the signal should be modulated for transmission. A tuner allows a user to select any one of the channels in the broadcast signal to be isolated from the signal and provided, for example, to a television set for viewing.

A tuner may include a pre-amplifier to control the gain of the broadcast signal provided to the various processing components of the tuner. For example, an automatic gain control (AGC) may be arranged at the front-end of the tuner to provide an adjustable gain to the broadcast signal in an effort to maintain the signal provided by the pre-amplifier at a substantially constant level. In particular, the AGC operates to keep the signal power within a dynamic range acceptable to downstream components of the tuner and to maximize signal strength while maintaining a low level of signal distortion.

SUMMARY OF THE INVENTION

Some embodiments include an automatic gain controller (AGC) for use in a tuner configured to isolate a selected channel from a multi-channel broadcast signal. The tuner is implemented substantially on two chips, a first chip comprising a radio frequency (RF) integrated circuit adapted for RF processing and a second chip comprising a digital integrated circuit adapted for digital processing. The automatic gain controller comprising a variable gain amplifier (VGA) implemented on the RF integrated circuit, the VGA adapted to receive the broadcast signal and to apply a variable gain to the broadcast signal based, at least in part, on a gain signal to provide an amplified broadcast signal, a power detector implemented on the RF integrated circuit and configured to detect at least one power characteristic of the amplified broadcast signal and to provide a power level signal indicative of the at least one detected power characteristics, and a gain controller implemented on the digital integrated circuit, the gain controller adapted to generate at least one error signal based, at least in part, on a comparison between the power level signal provided by the power detector and a reference signal, wherein the gain signal is based, at least in part, on the at least one error signal generated by the gain controller.

Some embodiments include an automatic gain controller (AGC) for use in a tuner adapted to isolate a selected channel from a multi-channel broadcast signal, the AGC configured to operate in a calibration mode adapted to calibrate the AGC, and an operation mode adapted to apply a variable gain to a broadcast signal. The AGC comprises a first control loop comprising a calibration signal generator adapted to generate a calibration signal, a power detector configured to detect at least one power characteristic of a received input signal and to provide a power level signal indicative of the detected at least one power characteristic, a summing element to combine the power level signal with an offset signal to provide an adjusted power level signal, a gain controller including a reference signal, the gain controller adapted to generate at least one error signal indicative of a difference between the reference signal and the adjusted power level signal, and an offset signal generator adapted to provide the offset signal to the summing element, the offset signal generator configured to adjust the offset signal based, at least in part, on the at least one error signal. The AGC further comprises a second control loop comprising a variable gain amplifier (VGA) adapted to receive the broadcast signal and to apply a variable gain to the broadcast signal based on a gain signal to provide an amplified broadcast signal, the power detector, the summing element, and the gain controller, wherein, in the calibration mode, the first control loop is operational and the received input signal to the power detector is the calibration signal, the first control loop operating to modify the offset signal such that it reflects an offset error of the AGC, and wherein, in the operation mode, the second control loop is operational and the received input signal to the power detector is the amplified broadcast signal, the second control loop operating to maintain a power level of the amplified broadcast signal within a desired range.

Some embodiments include a method of operating an automatic gain controller (AGC) for use in a tuner configured to isolate a selected channel from a multi-channel broadcast signal, the tuner implemented substantially on two chips, a first chip comprising a radio frequency (RF) integrated circuit adapted for RF processing and a second chip comprising a digital integrated circuit adapted for digital processing, the method comprising applying, on the RF integrated circuit, a variable gain to the broadcast signal based, at least in part, on a gain signal to provide an amplified broadcast signal, detecting, on the RF integrated circuit, at least one power characteristic of the amplified broadcast signal, providing, on the RF integrated circuit, a first power level signal indicative of the at least one power characteristic, receiving, on the digital integrated circuit, the first power level signal, generating, on the digital integrated circuit, an error signal based, at least in part, on a comparison between the first power level signal and a reference signal, and providing, on the RF integrated circuit, the gain signal based, at least in part, on the error signal.

DETAILED DESCRIPTION

As discussed above, a television tuner is a device that receives a television signal from a cable or terrestrial broadcast source and outputs a channel of interest, substantially rejecting all other channels. For example, the television tuner may receive a broadcast signal having a plurality of channels transmitted in respective frequency bands and isolate one of those channels to be demodulated and processed for viewing according to a user's channel selection. The details of how the information is arranged and modulated within the designated frequency band, and the designation and composition of the frequency band itself may depend on geographical location. For example, television signals broadcast in Japan adhere to a different standard than television signals broadcast in the United States. In addition, information may be digitally modulated, analog modulated, or both. However, many general concepts relating to isolating a desired channel from a broadcast signal are independent of the broadcast standard used in any particular geographical location.

Figure 1:
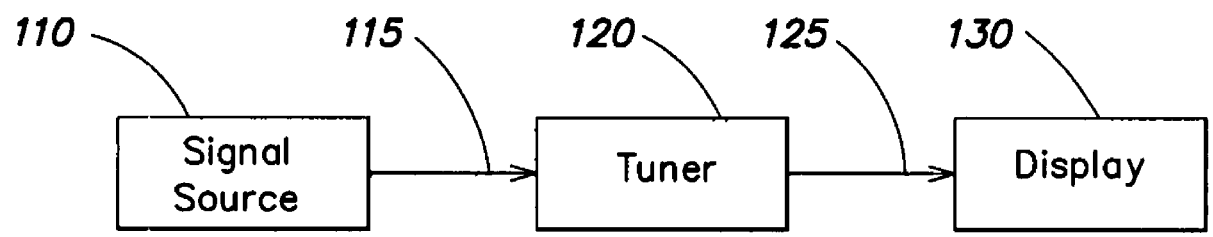
FIG. 1 illustrates a tuner in the context of a conventional television reception apparatus.

FIG. 1 illustrates a block diagram of a tuner in the context of a conventional television reception apparatus. Signal source 110 provides a broadcast signal 115 to tuner 120. Signal source 110 may be, for example, a cable connected to a set-top box or terrestrial broadcast source received via an antenna, and may provide either a digitally modulated or analog modulated signal 115. Broadcast signal 115 may be comprised of a plurality of channels, each channel occupying some designated bandwidth within the spectrum of the broadcast signal. For example, broadcast signal 115 may be composed of numerous television channels, only one of which may be of interest at any given moment in time. As discussed above, the designated bandwidth and the composition of the information within each channel typically depends on the broadcast standard under which the signal is transmitted.

Tuner 120 may be a user adjustable component capable of being set to select a desired channel from the broadcast signal and substantially reject each of the other channels present in the broadcast signal. Tuner 120 (or a separate component downstream from the tuner) may further process the single channel signal and demodulate the information in the signal from the carrier. The demodulation may be one or any combination of demodulators. For example, demodulation may support one or more digital modulation techniques, one or more analog modulation techniques, or both. The resulting demodulated signal may then be post-processed to create a signal 125 that can be displayed for viewing. For example, display 130 may be a plasma display, liquid crystal display, digital light projection display, a cathode ray tube display, or any other type of display capable of presenting the signal for viewing.

Figure 2:
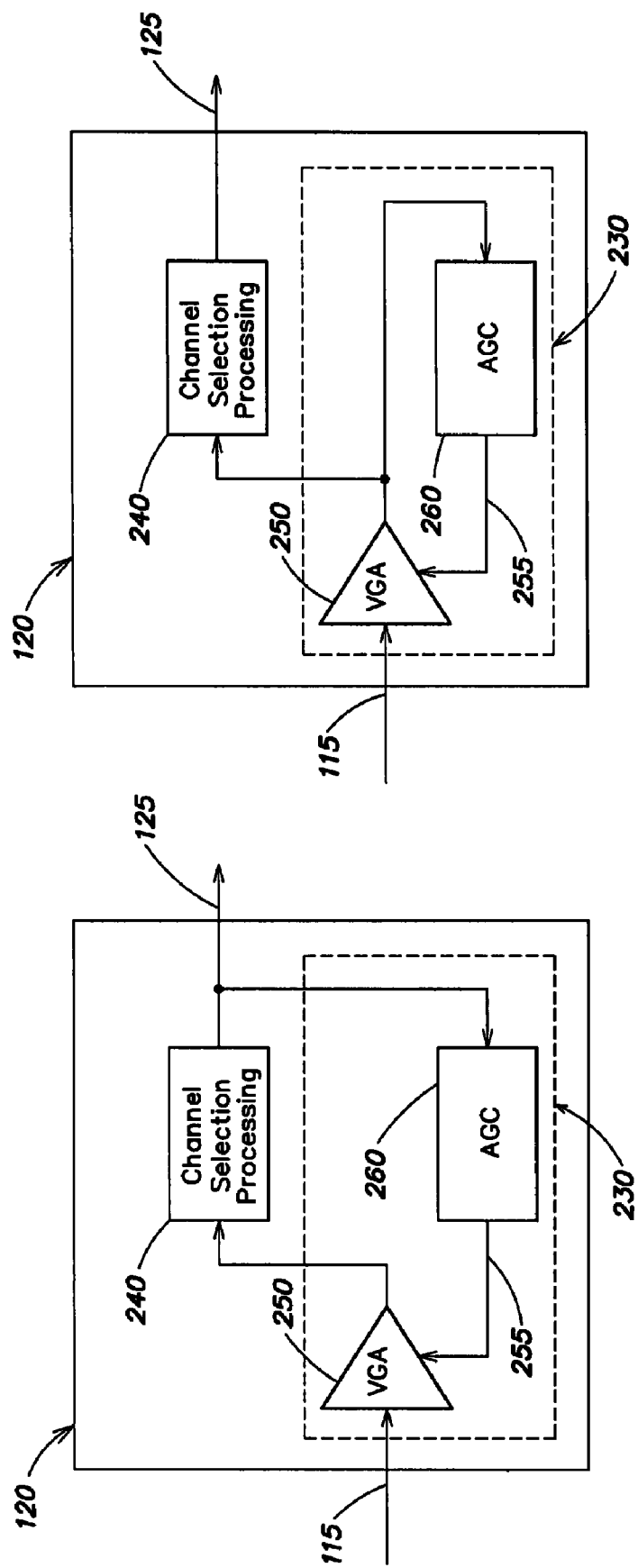
FIGS. 2a and 2b illustrate an automatic gain controller (AGC) for a tuner, the AGC operating on a single-channel signal, and an amplified broadcast signal, in accordance with some embodiments of the present invention.

FIG. 2 illustrates a more detailed view of two alternative implementations of tuner 120 illustrated in FIG. 1. Tuner 120 may be comprised of a pre-amplifier stage 230 and channel selection processing block 240. The pre-amplifier stage 230 may include a variable gain amplifier (VGA) 250 and an automatic gain control (AGC) 260. Broadcast signal 115 may be received from a cable or terrestrial broadcast source and amplified by VGA 250 according to the VGA gain as adjustably controlled by gain signal 255. The value of gain signal 255 may be determined by AGC 260 as described in further detail below. In channel selection processing block 240, one channel of the broadcast signal may be selected, and possibly demodulated, and post-processed.

For example, channel selection processing block 240 may include any of the circuits and components illustrated in U.S. Patent Publication No. 2006/0166633 ('633 publication), which is herein incorporated by reference in its entirety, or any other variety and arrangement of components adapted to select a desired channel from a broadcast signal. It should be appreciated that a tuner may include other components not illustrated in FIG. 2. Other tuners adapted to receive and process different types of television signals, such as those described in U.S. Pat. No. 7,091,792 ('792 patent), which is herein incorporated by reference in its entirety, may be suitable for use with the aspects of the present invention.

Broadcast signal 115 may be received at pre-amplifier 230 in a wide variety of conditions that may depend on such factors as the type of signal being transmitted, the type of transmission media, the modulation technique and/or the geographical location of the tuner itself. For example, broadcast signal 115 may be transmitted via a cable to tuner 120, or alternatively, broadcast signal 115 may be broadcast from a terrestrial source via wireless electromagnetic radiation and provided to tuner 120 from an antenna, satellite dish, or the like. When transmitted via a cable, broadcast signal 115 may have relatively low noise and high signal strength as compared to broadcast signals received from a terrestrial broadcast source, e.g., a base station. In addition, a tuner located in an area far from or obstructed from the broadcast source may receive a signal 115 of relatively low signal power and high noise as compared to a tuner 120 located near or in a substantially unobstructed relationship with the broadcast source.

To assist in processing signals having variable quality attributes (e.g., varying noise and signal strength characteristics), tuner 120 may comprise VGA 250 which receives variable gain control signal 255 from AGC 260 indicative of a level of gain to be applied to broadcast signal 115. A purpose of pre-amplification stage 230 is to ensure that the broadcast signal received by the front-end components of the tuner (e.g., channel selection processing block 240 and/or other downstream stages of the television reception apparatus) is provided with an adequately high signal to noise ratio (SNR) and sufficiently low distortion and within a relatively limited dynamic range. For example, the television tuner may receive an input signal ranging from approximately −85 dBm to 5 dBm. Without pre-amplification and automatic gain control, downstream processing blocks of the tuner would be required to handle this relatively large dynamic range. The pre-amplifier stage may be employed to reduce the dynamic range requirements of the tuner by maintaining the signal level within a reduced range.

FIG. 2a illustrates a tuner implementation wherein the AGC operates by processing the signal 125 after the channel selection processing block. That is, AGC 260 generates gain control signal 255 based on the single channel selected by the tuner after channel selection processing block 240. As recognized in the '633 publication, detecting characteristics of the single-channel signal has the generally undesirable effect of de-sensitizing the tuner. In particular, signal characteristics existing largely in channels other than the selected channel may be invisible to the detecting mechanisms of the AGC loop. Accordingly, because this AGC loop is effectively blind to certain broadcast signal conditions, the loop cannot vary the VGA gain to compensate before the selected channel is adversely affected.

FIG. 2b illustrates an implementation of a tuner from the '633 publication wherein the AGC operates by processing the amplified broadcast signal. By pulling back the detecting mechanisms of the AGC loop to the broadcast signal, various characteristics of the signal that adversely affect tuner performance, such as interferers, may be detected and appropriately addressed. AGC 260 controls the gain level on VGA 250 (via gain signal 255) to provide an appropriate amplification to broadcast signal 115. The resulting amplified broadcast signal may then be provided to channel selection processing block 240. However, rather than forming the AGC control loop by analyzing properties of the single-channel signal (i.e., signal 125) as in FIG. 2a, AGC 260 generates gain control signal 255 based on properties of the amplified broadcast signal.

In FIG. 2b, AGC 260 receives the amplified broadcast signal directly from variable gain amplifier 210. However, the tuner is not limited in this respect. Some filtering or other processing may occur after amplification and before the AGC taps off the broadcast signal. For example, the broadcast signal may be low-pass filtered to remove very high frequency noise outside the broadcast spectrum before or after amplification, thus leaving the broadcast signal substantially intact. Alternatively, one or more channels within the broadcast signal may be rejected without removing significant information or a substantial number of channels from the broadcast signal. It may be preferable to analyze the broadcast signal immediately after amplification to ensure that signal properties in any band that may deteriorate tuner performance are detected before front-end processing filters cancel out the offending frequencies.

Applicant has appreciated that tuner performance may be generally optimized by adopting a two-chip tuner design. In particular, Applicant recognized that various tuner processes may function optimally using a particular chip design. For example, radio frequency (RF) processing (e.g., pre-amplification, RF portions of channel selection, and other functionality performed on RF signals) may be more suited to a bipolar complementary metal oxide semiconductor (BiCMOS) process because of the availability of bipolar transistors, while digital processing (e.g., various digital portions of channel selection, demodulation, post-processing, etc.) may be more suited to a fine-line CMOS process. Moreover, Applicant has appreciated that conventional tuner designs may be vulnerable to interference between the various components of the tuner. For example, RF processing may interfere with analog-to-digital conversion and digital processing may interfere with RF functions, if implemented on a shared substrate.

Similarly, Applicant has recognized that certain portions of an AGC may be more suitably implemented on one chip rather than another, and that by dividing the AGC appropriately, the AGC may be implemented optimally in a two-chip design to exploit the different capabilities of the two-chips and/or to reduce interference between different processes. According to some embodiments, a tuner is implemented substantially on two-chips, a first chip that incorporates, in large part, the RF processing components of the tuner, and a second chip that incorporates, in large part, the analog-to-digital conversion and digital processing components of the tuner, as described in further detail below. Accordingly, the AGC components may be distributed substantially over the two-chips according to an RF/digital processing separation.

For example, an AGC for a tuner pre-amplification stage may be generally classified as having two main components (which may be formed from a combination of multiple smaller components): (1) a power detector to determine the power level in the broadcast signal; and (2) a control component adapted to transform the detected power into a control signal for a variable gain amplifier. In some embodiments, the power detector may be implemented on a first chip (e.g., as an RF process) and the control components on a second chip (e.g., as a digital process). The distribution of the AGC control loop over two-chips may reduce or eliminate interference between the RF and digital processing, and may allow for increased optimization in the two-chip framework. For example, RF components may be integrated on a chip optimized for RF processing, while digital components may be integrated on a chip optimized for digital processing. Accordingly, both processes may operate in an optimized environment without interfering with each other.

Figure 3:
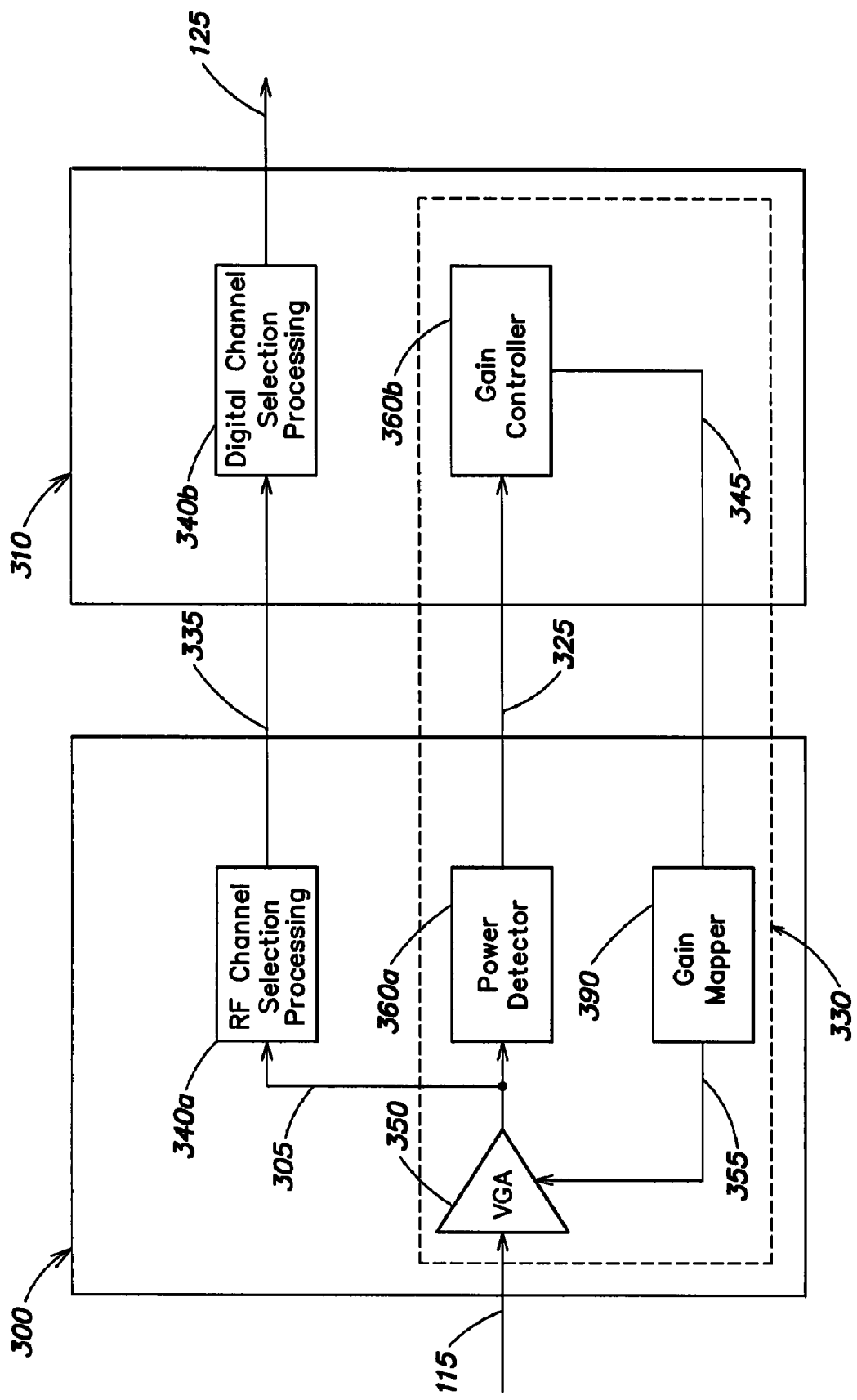
FIG. 3 illustrates portions of a tuner including an automatic gain control implemented on two integrated circuits, in accordance with some embodiments of the present invention.

FIG. 3 illustrates a tuner implemented on two separate integrated circuits, in accordance with some embodiments of the present invention. Some components of the tuner are split so that they are implemented partly on the first integrated circuit 300 and partly on the second integrated circuit 310. For example, the channel selection processing block can be separated into RF channel selection processing block 340a, implemented on the first integrated circuit 300, and digital channel selection processing block 340b, implemented on the second integrated circuit 310. AGC 330 may also be implemented across the two chips. For example, the components forming the AGC may be broadly categorized into a power detector component 360a and a gain controller component 360b, where the power detector 360a is implemented on the first integrated circuit 300, and the gain controller 360b is implemented on the second integrated circuit 310.

In some embodiments, the first integrated circuit is an RF integrated circuit adapted for RF processing, and the second integrated circuit is a digital integrated circuit adapted for digital processing. The term "RF integrated circuit" refers herein to an integrated circuit that includes primarily RF components and/or processes and/or that is fabricated in such a way as to facilitate RF processing. Likewise, the term "digital integrated circuit" refers herein to an integrated circuit that includes primarily digital component and/or processes and/or that is fabricated in such as way to facilitate digital processing.

For example, a two-chip design generally separating RF and digital processing may include two similarly fabricated chips on which primarily RF processes and primarily digital processes are implemented, respectively, to avoid interference and/or the two chips may be fabricated differently to generally facilitate and/or optimize the respective processing environment. It should be appreciated that an RF integrated circuit may include some digital processing (or other non-RF analog processing), and a digital integrated circuit may include some RF processing and/or other non-RF analog processing, as the aspects of the invention are not limited in this respect. Similarly, the use of the terms "RF" and "digital" to modify tuner components (e.g., RF channel selection processing block) denotes which integrated circuit the component is implemented on. Thus, a component labeled as RF or digital may include RF, digital or analog aspects, as the terms generally specify the chip on which the component is located.

For the tuner illustrated in FIG. 3, the broadcast signal 115 may be received by the first integrated circuit 300, wherein pre-amplification stage 330 operates to adjust the gain of the broadcast signal to maintain the power level of the signal within a desired range. On the first integrated circuit 300, the broadcast signal 115 may first be amplified by VGA 350 based upon the value of a gain control signal 355 generated by gain controller 360b. The amplified broadcast signal may then be provided to a power detector 360a. The power detector 360a may detect one or more power characteristics of the amplified broadcast signal and generate a detected power level signal 325 indicative of the detected power characteristic(s). The term "power characteristic" refers to any one of a combination of a value, property or attribute of a signal indicative of the power level of the signal. For example, a power characteristic may be a direct power measurement such as the root mean square (RMS) value of the signal or may be statistically related to the power such as the envelope of the signal. Other power characteristics include, but are not limited to, peak value, peak-to-envelope ratio (PER), peak-to-average ratio (PAR), etc.

The detected power level signal 325 generated by the power detector may then be provided to the second integrated circuit 310 for further processing to determine how to change the gain of the VGA to maintain the power level of the broadcast signal within a tolerated range. For example, gain controller 360b may determine an error signal 345 based, at least in part, on the detected power level 325, that attempts to maintain the amplified broadcast signal at a desired level to reduce the dynamic range requirements of downstream processing components. Any of various control mechanisms may be used to form gain controller 360b, including, but not limited to, traditional control methods such as proportional control, integral control, proportional-integral control, derivative control, proportional-derivative control, integral-derivative control, proportional-integral-derivative control, etc., as the aspects of the invention are not limited in this respect.

The gain controller 360b may provide error signal 345 to the first integrated circuit 300, and in particular, to gain mapper 390. Gain mapper 390 may transform the error signal 345 into gain control signal 355 that tends to decrease the magnitude of the error. Gain mapper 390 may, for example, include one or more look-up tables that transform error values into corresponding gain signals or may include a proportional gain function to appropriately scale the error values or any other mechanism suitable for mapping error values to appropriate gain changes to be applied to VGA 350. In some embodiments, gain mapper 390 may be implemented on integrated circuit 310 rather than 300, as the aspects of the invention are not limited in this respect. In other embodiments, error signal 345 is directly applied to VGA 350 without an intervening gain mapper.

VGA 350 receives the gain control signal 355 and amplifies the broadcast signal accordingly. As discussed above, AGC control loop 330 comprising the VGA 350, power detector 360a and gain controller 360b are configured to maintain amplified broadcast signal 305 at a suitable amplitude for the channel selection processing block. The amplified broadcast signal 305 may be provided to RF channel selection processing block 340a on the first integrated circuit 300. The RF channel selection processing block 340a may include various RF processing components configured to isolate a selected channel from the broadcast signal, which may be further processed on the second integrated circuit 310 by digital channel selection processing block 340b. Digital channel selection processing block 340b may include various digital processing components configured to transform the signal received from the first integrated circuit 310 into a video signal and/or audio signal that can be presented to a user, as discussed in further detail below.

Figure 4:
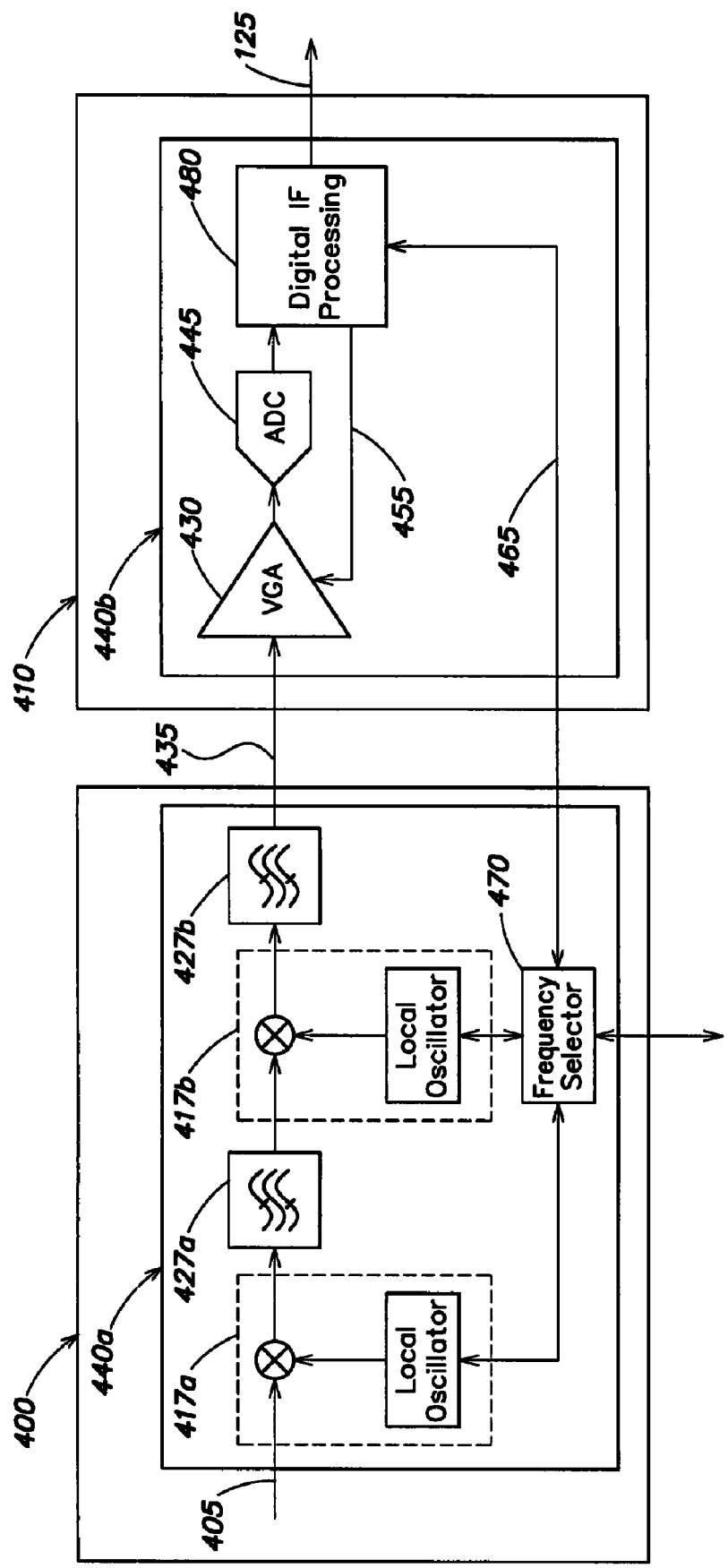
FIG. 4 illustrates exemplary components of a channel selection process implemented over two integrated circuits, in accordance with some embodiments of the present invention.

FIG. 4 illustrates channel selection components of a two-chip tuner separated generally into RF processing components and digital processing components, in accordance with some embodiments of the present invention. For example, RF channel selection processing block 440a illustrates one exemplary implementation of RF channel selection processing block 340a illustrated in FIG. 3. Similarly, digital channel selection processing block 440b illustrates one exemplary implementation of digital selection processing 340b in FIG. 3. RF channel selection processing block 440a may be implemented on an RF integrated circuit 400 generally optimized for RF processing, and the digital channel selection processing block 440a may be implemented on a second integrated circuit 410 generally optimized for digital processing. The amplified broadcast signal 405 corresponds to the amplified broadcast signal provided by VGA 350 illustrated in FIG. 3.

RF channel selection processing block 440a may be implemented as a dual conversion mixing stage, including a first mixer/oscillator pair 417a, a bandpass filter 427a, a second mixer/oscillator pair 417b, and optionally a second bandpass filter 427b. The dual conversion mixing stages operate to up-convert the frequencies of the broadcast signal such that the selected channel is substantially centered about a desired first intermediate frequency, filter a desired number of channels from the signal, down convert the frequencies of the remaining channels such that the selected channel is substantially centered about a second intermediate frequency, and optionally further filter out channels proximate the selected channel.

For example, the amplified broadcast signal 405 may be input to first mixer/oscillator pair 417a. The frequency of the oscillator may be varied by frequency selector 470, which may be controlled by input from a user selecting a channel to be viewed, or accessed from the digital processing portion and/or an external connection. The mixer/oscillator pair 417a may heterodyne the amplified broadcast signal 405 with the signal provided by the local oscillator operating at a selected frequency to shift the frequencies of the broadcast signal such that the selected channel is substantially centered about a desired first intermediate frequency. For example, first mixer/oscillator pair 417a may shift the frequencies such that the frequency content of the first intermediate frequency broadcast signal is above the range of frequencies in the amplified broadcast signal, to avoid conflicts with image frequencies and harmonics.

The first intermediate frequency signal may then be provided to bandpass filter 427a having a predetermined passband about the first intermediate frequency that allows signals in a desired frequency range to pass, while substantially rejecting all other frequencies. For example, bandpass filter 427a may have a pass band suitable for passing substantially a single channel of the broadcast signal. Alternately, bandpass filter 427a may have a pass band that permits more than one channel to pass, for example, by narrowing the broadcast signal to two or more channels. In some embodiments, bandpass filter 427a is implemented as an external filter, for example, an external SAW filter having a pass-band configured to narrow the signal to one or more channels, while rejecting other frequencies. However, the filter may be any type of bandpass filter, as the aspects of the invention are not limited in this respect.

The output of bandpass filter 427a is then passed to a second mixer/oscillator pair 417b. Mixer/oscillator pair 417b may convert frequencies of the input signal according to the frequency of the signal provided by the local oscillator, such that the selected channel is substantially centered about a second intermediate frequency. In some embodiments, the second mixer/oscillator pair 417b down-converts the frequencies such that the selected channel is centered around the baseband frequency of the tuner, while in other embodiments the second mixer/oscillator pair 417b down-converts the frequencies such that the selected channel is centered around a desired intermediate frequency.

The output of the second mixer/oscillator pair 417b may be further filtered depending on whether bandpass filter 427a is arranged to pass a single or multiple channels from the broadcast signal. For example, the output of the second mixer/oscillator pair 417b may be provided to bandpass filter 427b to further reject channels proximate to the selected channel. Signal 435 provided by RF channel selection processing block 440a may include, essentially, only the selected channel from the broadcast signal centered about the baseband frequency of the television receiving apparatus or at some other desired intermediate frequency, or the selected channel and one or more proximate channels or portions of proximate channels.

The RF channel selection processing block 440a provides signal 435 to the digital channel selection processing block 440b on digital integrated circuit 410. Digital channel selection processing block 440b may include a feedback loop comprising a VGA 430, an analog-to-digital converter 445, and a digital intermediate frequency (IF) processing block 480. The output of the digital channel selection processing block 440b may be a video signal and/or audio signal 125 that can be displayed and/or provided to a speaker component for presentation to the user. One embodiment of digital channel selection processing block 440b may operate as follows.

Signal 435 provided to digital channel selection processing block 440b may be amplified by VGA 430. The gain of the VGA is determined by gain control signal 455. The amplified signal may then be converted to a digital signal by an analog-to-digital converter 450, so that the remainder of the gain control process may be handled digitally. If signal 435 is at an intermediate frequency signal rather than at baseband frequency, then digital IF processing 440b may reduce the frequency of the signal down to baseband and demodulate the selected channel. Digital IF processing 440b may also comprise post-processing that may include any of numerous processing components implementing techniques that may depend on the type and content of signal 435.

Post processing may include any number of and/or combination of filtering, demodulating, video and audio processing, decoding and encoding, decompression, etc., deemed necessary to prepare the signal to be presented to the user, via an audio and/or video presentation. Digital IF processing 480 may also output a gain control signal 455 that is input to VGA 430. Any of various control mechanisms, including those described herein, may be used to generate gain control signal 455. Digital IF processing 480 may also communicate with frequency selector 470 to control which channel is to be selected.

It should be appreciated that the channel selection components of a tuner adapted to isolate a selected channel may include numerous other components, or may select a desired channel in other ways. For example, single conversion methods may be implemented instead of the dual conversion type front-end illustrated in FIG. 4. The components illustrated in FIG. 4 are merely exemplary of some embodiments of components that form a channel selection process generally separated into RF and digital processes and distributed in a substantially two-chip design over respective RF and digital integrated circuits. As such, the aspects of the invention are not limited for use with any particular configuration of channel selection components, and other tuner configurations adapted to receive and process different types of television signals may be used. For example, any of the various dual chip designs described in the '792 patent may be suitable for use with the aspects of the present invention.

Figure 5:
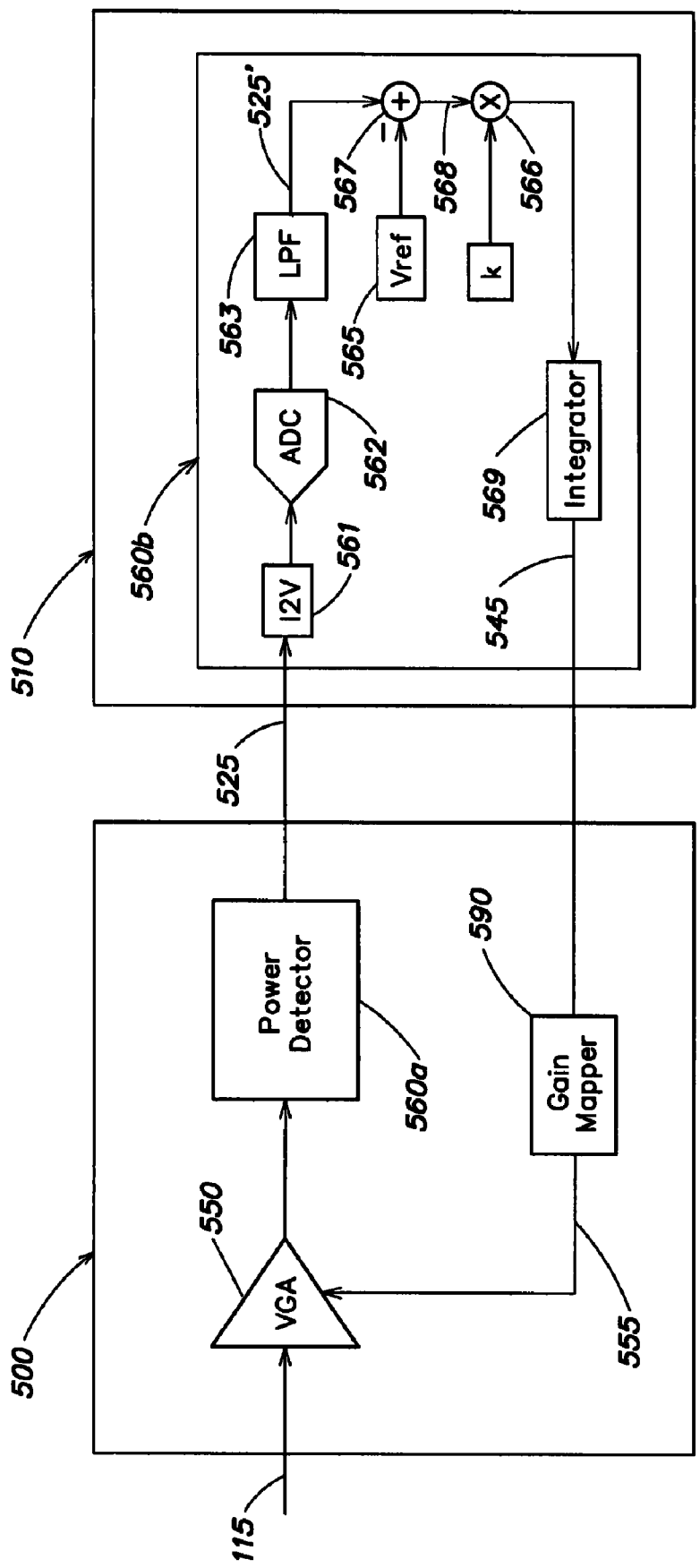
FIG. 5 illustrates exemplary components of an AGC implemented on two integrated circuits, in accordance with some embodiments of the present invention.

As discussed above, Applicant has appreciated that separating the AGC generally into RF processing components and digital processing components may benefit and enhance a substantially two-chip tuner design, some embodiments of which were described in connection with FIG. 3. FIG. 5 illustrates one implementation of an AGC control loop implemented substantially on two-chips, in accordance with some embodiments of the present invention. As discussed, the two-chip design may benefit from implementing power detector 560a on the RF integrated chip 500 and the gain controller 560b on the digital integrated chip 510. FIG. 5 illustrates exemplary components of one gain controller that may be suitable for use with the aspects of the present invention.

As discussed above, a VGA 550 may be implemented on the RF integrated circuit 500 to receive a broadcast signal and adjust the gain in order to maintain the power in the signal in a tolerated range. A power detector 560a may be implemented on the RF integrated circuit to detect one or more power characteristics of the amplified broadcast signal and provide a detected power level signal 525 indicative of the one or more detected power characteristics. The detected power level signal 525 may then be provided to gain controller 560b to transform the detected power into a gain adjustment for the VGA. Gain controller 560b may operate as follows.

The detected power level signal 525 received from power detector 560a may be converted to a voltage signal, for example, using an I-to-V transimpedance amplifier 561. It should be appreciated that if the detected power level signal 525 is natively a voltage signal, I-to-V amplifier 561 or other conversion elements may be unnecessary. In some embodiments that use an I-to-V transformation, the conversion element (e.g., transimpedance amplifier 561) may be implemented on the RF integrated circuit 500 instead of the digital integrated circuit 510, as the aspects of the invention are not limited in this respect.

The transformed voltage signal provided by I-to-V amplifier 561 may then be converted to a digital signal via analog-to-digital converter 562. The digital signal may then be filtered with a low-pass filter 563 to remove high-frequency variations in the detected power level to improve the estimate of the signal gain. In some embodiments, a down sampling block may be included. The digital detected power signal 525' may then be compared with a reference signal 565 indicative of a desired power level in the broadcast signal.

In particular, a reference signal such as voltage reference (Vref) 565 may be selected to indicate a power level to which the AGC attempts to maintain the power level in the amplified broadcast signal as closely as possible. The voltage reference may be selected based on the performance specifications of downstream processing components such as the channel selection processing block, or selected based on other design considerations for the tuner. The digital power level signal, therefore, may be subtracted from the reference signal 565 (or vice versa) via summation element 567 to generate an error signal 568. Error signal 568 operates as a measure of how far the detected power characteristics of the broadcast signal deviate from desired values.

The AGC control loop is configured to drive error signal 568 to zero to maintain power characteristics of the amplified broadcast signal at a level indicated by the reference signal 565. Error signal 568 may then be scaled by a programmable gain parameter k via multiplication element 566 to modify the time constant of the closed loop system which controls how quickly the VGA 550 reacts to changes in the power level of the broadcast signal 115. The scaled error signal may then be provided to integrator 569 which integrates the error between the detected power level signal and the reference signal.

In some embodiments, the controller is configured such that when the gain of the broadcast signal 115 is too high (e.g., when the detected power level signal is greater than the reference signal), the error signal will be positive and the output of the integrator 569 will increase, and when the gain of the broadcast signal is too low (e.g., when the detected power level signal is less than the reference signal), the error signal will be negative and the output of the integrator 569 will decrease. In other embodiments, the controller is configured such that when the gain of the broadcast signal 115 is too high, the error signal will be negative and the output of the integrator will decrease, and when the gain of the broadcast signal is too low, the error signal will be positive and the output of the integrator 569 will increase. It should be appreciated that either embodiment may be implemented by switching the signs of the signals providing to the summing element.

The integrator 569 provides an integrated error signal 545 to gain mapper 590. As discussed above, gain mapper 590 may be configured to map values of the integrated error signal 545 to gain values represented by gain control signal 555. Gain control signal 555 may then be provided to VGA 550 to adjust the gain in a direction that tends to decrease the absolute value of error signal 568. Accordingly, the AGC control loop operates to maintain the power level of the amplified broadcast signal as close to the reference signal as possible. As discussed above, gain mapper 590 may be implemented on either chip, or in some embodiments may be unnecessary altogether. In addition, the AGC control loop may also include a digital-to-analog converter (DAC) to convert the signal from the gain controller from a digital signal to an analog signal before being provided to the VGA. The DAC may be implemented on either chip and may depend on where the gain mapper (if provided) is implemented.

It should be appreciated that the above implementation of an AGC is merely exemplary and that other implementations may be suitable. In particular, the above described implementation illustrates one example of how an AGC may be generally distributed over two-chips, separating the primary functionality into RF and digital components, respectively. However, other implementations may be suitable for use with the aspects of the present invention. In particular, but not limited to, other implementations that generally comport with a two-chip design may be used, as the aspects of the invention are not limited in this respect.

AGC's, and particularly the various components of an AGC control loop, may be vulnerable to certain errors. One common error is referred to herein as an "offset error." Offset errors may occur as a result of changes in environmental conditions, such as temperature and humidity, and more significantly result from variations in the specifications of the electronic components that make up the AGC and associated control loop. An offset error refers generally to the difference between the actual value that a control loop converges to and the desired value that the control loop is intended to converge to. In an AGC, this can result in the control loop converging to a power level that is either too large or too small, thus exposing downstream processing components to non-optimal power levels.

Conventionally, offset errors have been addressed at the time of manufacture using various calibration techniques that typically involve testing and trimming the components of the AGC. Such conventional calibration techniques, however, are relatively expensive. For example, offset errors may be evaluated after manufacture but before sale and the components of the AGC control loop trimmed to compensate for the difference in the actual and desired convergence values of the AGC. Such trimming processes require relatively significant resources and may substantially increase the cost of manufacture.

Applicant has appreciated that an automatic calibration routine that operates on startup may eliminate the necessity of testing and trimming at the time of manufacture. According to some embodiments, a tuner includes a calibration process that calibrates the AGC to compensate for offset errors. The calibration may be performed automatically upon power up or upon manual activation, to obviate the need (and thus the expense) for post-manufacturing testing and trimming in this respect. In some embodiments, the calibration process utilizes the same control loop as the AGC to increase the accuracy of the calibration, as discussed in further detail below.

Figure 6:
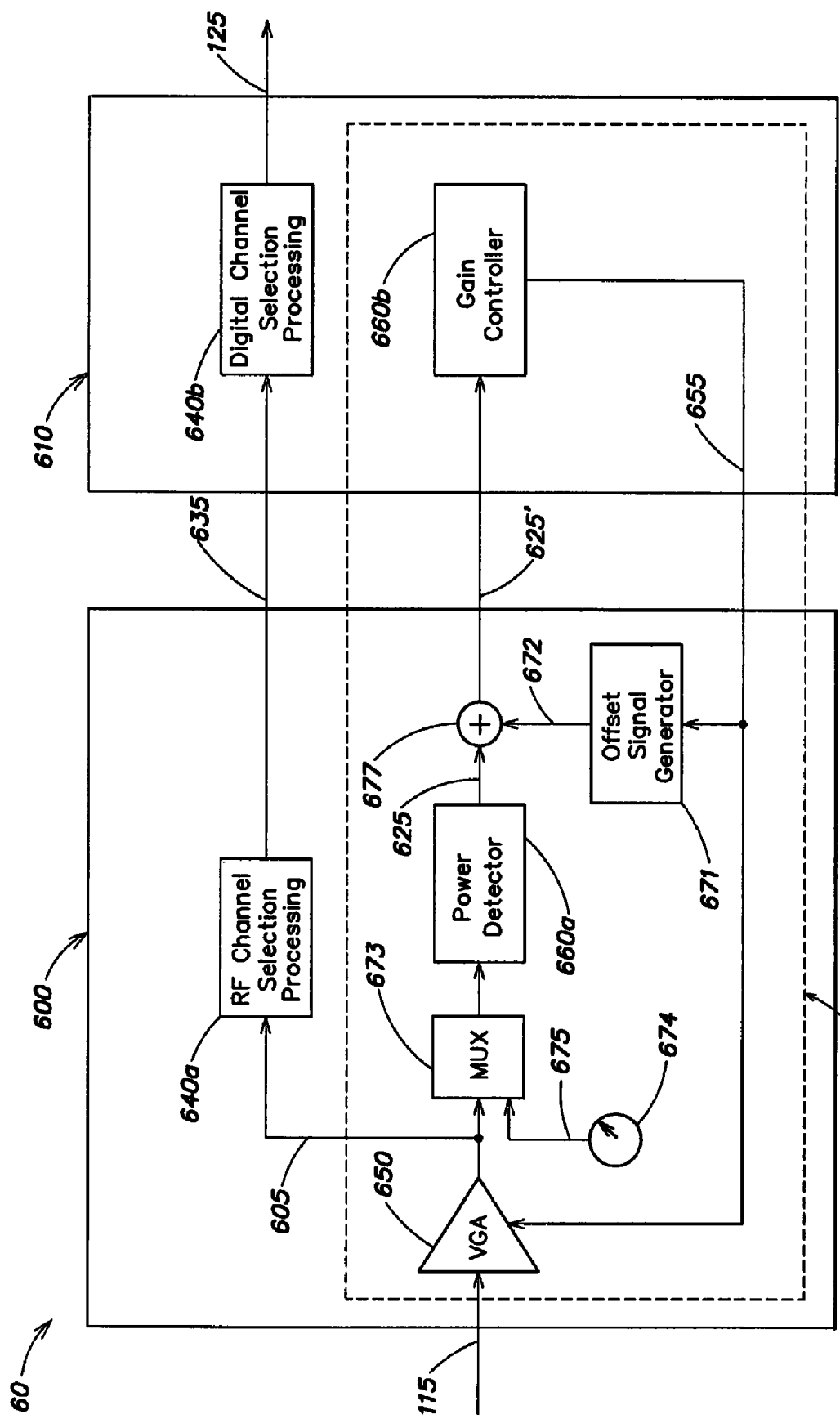
FIG. 6 illustrates a calibration process for an AGC implemented on two integrated circuits, in accordance with some embodiments of the present invention.

FIG. 6 illustrates a tuner with a calibration process for calibrating an AGC to compensate for offset errors, in accordance with some embodiments of the present invention. Tuner 60 may be similar to the tuner illustrated in FIG. 3. In particular, the tuner in FIG. 6 may be substantially a two-chip design generally separating RF and digital processing components on respective integrated circuits. However, tuner 60 also includes components of a calibration process configured to perform a calibration operation on AGC 630 that may obviate the need to perform post manufacture testing and trimming in this respect.

In particular, tuner 60 includes a calibration signal generator 674, an offset signal generator 671, and a summing amplifier 677. The dotted lines in FIG. 6 denote connections that may be active only during the calibration process and inactive after calibration has been completed and until the calibration process is re-initiated (e.g., on power-up). The calibration operation is accomplished, at least in part, via the determination of an offset signal which adjusts the detected power level signal provided by power detector 660a by an amount determined to compensate for an offset error of the AGC estimated during the calibration operation, as discussed in further detail below.

To calibrate the AGC, a calibration signal with a generally known power may be generated by calibration signal generator 674 located, preferably, on RF integrated circuit 600. The power of the calibration signal may correspond to the desired power level of the broadcast signal input to the channel selection processing block during operation, and thus may equal the reference signal used by the gain controller (e.g., the power of the calibration signal may equal the power of $V_{ref}$ 565 shown in FIG. 5). As such, absent an offset error, the difference between the output of the power detector and the reference signal (e.g., error signal 568 illustrated in FIG. 5) should theoretically be zero. However, offset errors in the AGC control loop (e.g., in the power detector and/or elements of the gain controller) may cause the actual error signal to be non-zero (e.g., the detected power level may be offset from its true value), even when the actual power characteristic of the broadcast signal is equal to the reference signal.

During calibration, the calibration control loop operates to adjust the offset signal such that the error signal converges to zero or near zero with respect to the power of the generated calibration signal. Once the error signal converges to zero or near zero, the offset signal reflects the offset error which is then subtracted from the output signal of the power detector during operation of the tuner, as discussed in further detail below. In one embodiment, the calibration signal includes a sine wave generated by a ring oscillator. The use of a ring oscillator allows for a relatively inexpensive component that generates a consistent and known voltage and power. Any of various well known ring oscillators may be implemented as the calibration signal generator, as the aspects of the invention are not limited in this respect. In addition, other types of calibration signals and calibration signal generators may be used, as the aspects of the invention are not limited for use with any particular type or arrangement of signal and/or signal generator.

The calibration process may begin upon start-up or power-up of the tuner, or upon restart, or may be activated manually at some desired time. When the calibration process is initiated, calibration generator 674 provides a calibration signal 675 to multiplexer 673, which selects the calibration signal 675 during calibration and the amplified broadcast signal 605 during normal operation. The output of the multiplexer is provided to power detector 660a which detects one or more power characteristics of the received signal and provides a detected power level signal 625. In the presence of offset errors, the detected power level signal 625 may be incorrect, due at least in part, to variations in the operating characteristics of the components comprising the power detector. Accordingly, some portion of the offset error may be a result of power detector 660a.

Summing element 677 combines the detected power level signal 625 with the offset signal 672, which is adjusted during calibration to compensate for the offset error, and may initially be set to a default value, which could be zero or any other desired number to initiate the calibration process. The adjusted power level signal 625' provided by summing element 677 may then be provided to gain controller 660b located on the digital integrated circuit 610. The adjusted power level signal may be converted to a digital signal and processed according the various methods described in connection with FIG. 5, or any other suitable control method(s).

For example, gain controller 660a may generate an error signal by computing the difference between the adjusted power level signal (or a digital equivalent of the adjusted power level signal) and a reference signal selected to match the power level in the calibration signal. The error signal may then be scaled and integrated, or any other control processing may be applied by the gain controller to generate an error signal indicative of the difference between the adjusted power level signal and the reference signal. The gain controller may optionally transform the error signal into a gain signal or other appropriate signal for use in the control loop. Preferably, the same control elements in gain controller 660b used during operation are used during calibration. The output of gain controller 660b may then be provided to the offset signal generator to determine how to adjust the offset signal to decrease the magnitude of the error signal.

It should be appreciated that the calibration control loop and the AGC control loop in FIG. 6 are substantially the same. That is, both control loops include the same power detector and the same gain controller control elements. By sharing the same control loop, the calibration process will operate using the same or substantially the same components (and thus will "see" the same offset error) as during operation, thus increasing the accuracy of the calibration. It should be appreciated that other control loops may be used. However, whichever control loop is implemented, benefits may be derived from having substantial overlap in the components comprising the AGC control loop used during operation and the calibration control loop used during calibration, however this is not a limitation of the aspects of the invention.

Figure 7:
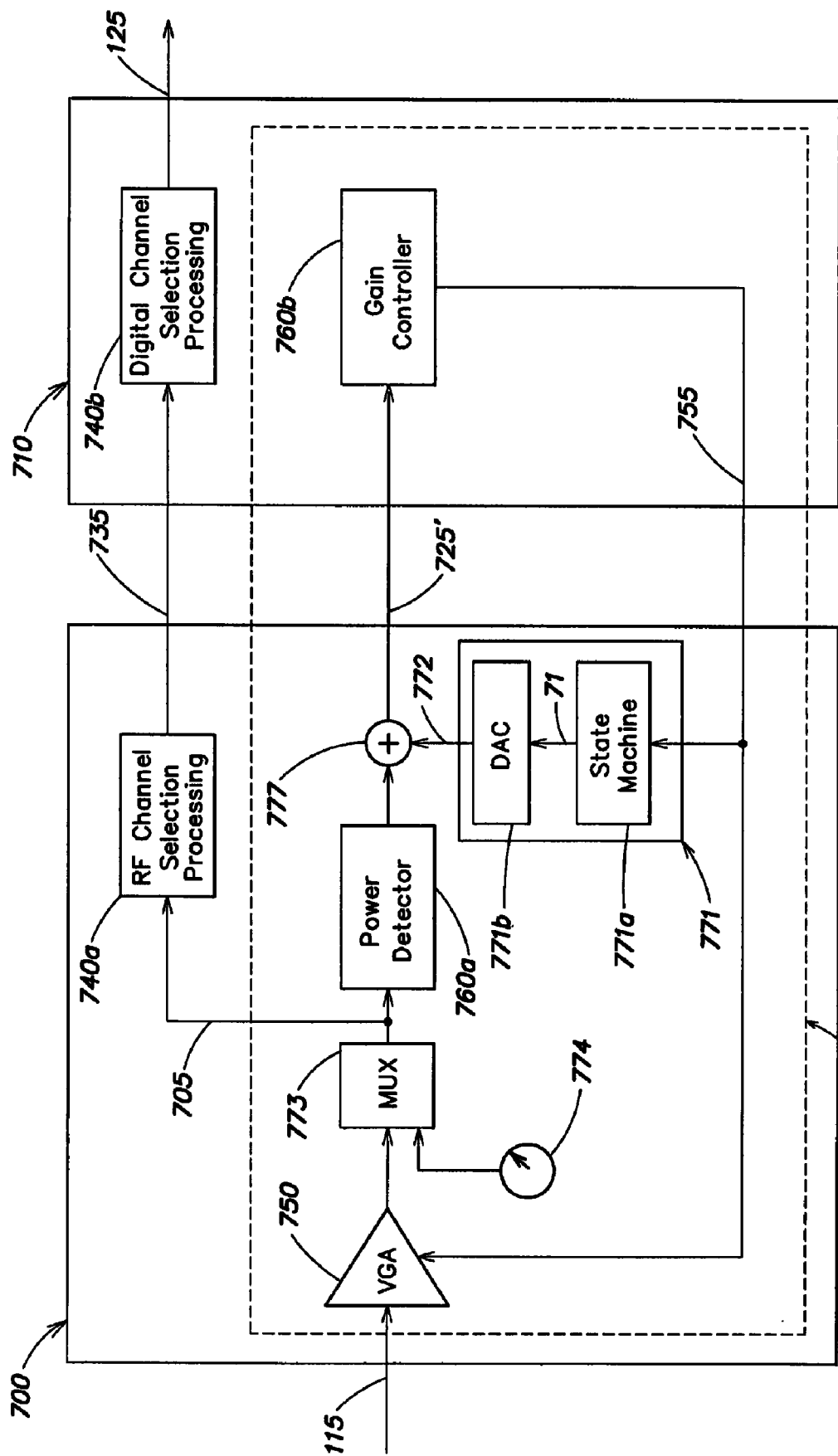
FIG. 7 illustrates exemplary components of an offset signal generator for a calibration process, in accordance with some embodiments of the present invention.

FIG. 7 illustrates an AGC for a tuner having an integrated calibration process similar to the calibration process illustrated in FIG. 6. However, the calibration control loop includes a state machine 771a and digital-to-analog converter (DAC) 771b illustrating one possible implementation of an offset signal generator, in accordance with some embodiments of the present invention. DAC 771b may receive a DAC code 71 and transform DAC code 71 into offset signal 772. The DAC code may be a digital number stored by offset generator 771, which the DAC converts to its analog equivalent to be combined with the output of the power detector. The DAC code may be initially set to a default value, which could be zero (i.e., to initiate calibration with an assumption that the offset error is zero) or any other desired number in a range of numbers that the DAC code can represent.

State machine 771a may be adapted to adjust the DAC code based, at least in part, on the signal 755 (e.g., the integrated error signal) provided by gain controller 760b in a direction that tends to cause the control loop to converge (i.e., tends to drive the error signal of the gain controller to zero). It should be appreciated that state machine 771a may be implemented in a variety of ways, and that other controllers adapted to adjust the offset signal to reduce the error signal may be used instead, as the aspects of the invention are not limited in this respect.

Figure 8:
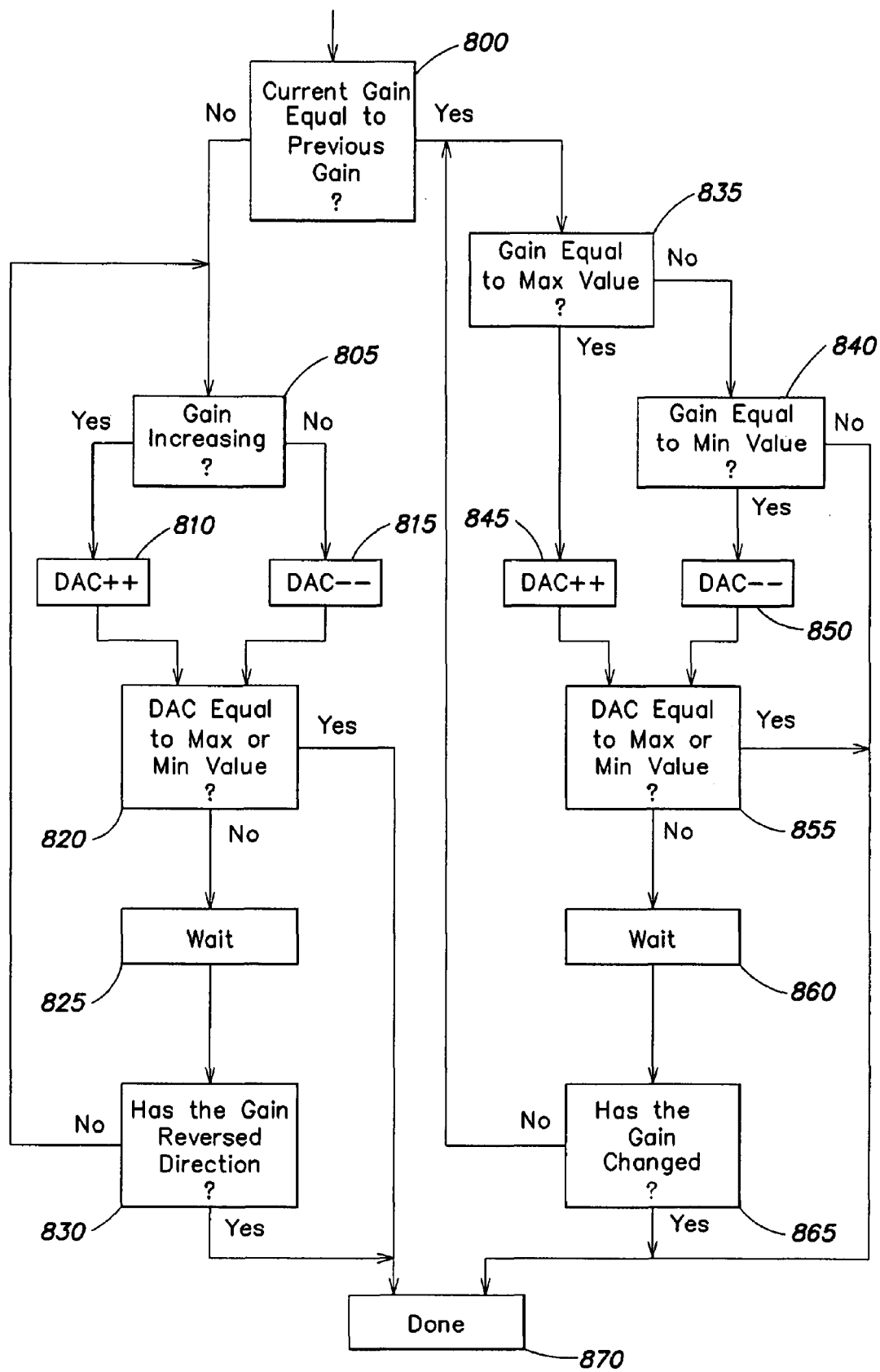
FIG. 8 illustrates a state machine for an offset signal generator, in accordance with some embodiments of the present invention.

FIG. 8 illustrates a state machine for adjusting a DAC code to approximate an offset error, in accordance with some embodiments of the present invention. The state machine of FIG. 8 monitors the signal provided by the gain controller (e.g., the integrated error signal) at regular intervals and retains the three most recent values. The most recent value is denoted v1, the second most recent value is denoted v2, and the third most recent value is denoted v3. In step 800, the values of v1 and v2 are compared to determine whether their values are equal. If the values of v1 and v2 are not equal, then step 805 may be performed. In step 805, it is determined whether the gain is increasing (v1>v2) or decreasing (v1<v2). If the gain is increasing, then the DAC code is presumed to be too small, and the DAC code is incremented by one unit in step 810.

If the gain is decreasing, then the DAC code is presumed to be too large, and the DAC code is decremented by one unit in step 815. In step 820, it is determined whether the current value of the DAC code is equal to the maximum or minimum value. If the DAC code is equal to the maximum or minimum value, then the calibration is complete and the state machine proceeds to step 870 where the calibration control loop is deemed converged. That is, if the DAC code has increased to a predetermined maximum value, or decreased to a predetermined minimum value, the respective maximum or minimum value is used as the DAC code during operation to approximate an offset error.

If the DAC code is not equal to the maximum or minimum value, then in step 825, the state machine waits for the next value from the gain controller to continue the adjustment of the DAC code. After receiving the next gain control value, it is determined whether the values of the gain control signal changed direction in step 830. A change of direction indicates that a zero crossing occurred and that the DAC code for that zero crossing satisfactorily reflects the offset error. The values will have changed direction if v1>v2 and v2<v3 or if v1<v2 and v2>v3. If the values changed direction, then the calibration is complete and the state machine may proceed to step 870 where the current DAC code is used to approximate the offset error. If the values did not change direction (e.g., v1<v2<v3 or v1>v2>v3), then the state machine proceeds to step 805 to continue adjusting the DAC code in an attempt to converge the calibration control loop (e.g., to attempt to reach step 870).

If at step 800 the values of v1 and v2 are equal, it is determined in steps 835 and 840 whether v1 is equal to the maximum or minimum possible values of the signal provided by the gain controller. If v1 is not equal to either the minimum or the maximum, then the calibration is complete and the state machine may proceed to step 870. If v1 is equal to the maximum value, then the DAC code is incremented by one unit in step 845, and if v1 is equal to the minimum value, then the DAC code is decremented by one unit in step 850. After incrementing or decrementing the DAC code, it is determined in step 855 whether the current value of the DAC code is equal to the maximum or minimum value. If the DAC code is equal to the maximum or minimum value, then the calibration is complete and the state machine proceeds to step 870. If the DAC code is not equal to the maximum or minimum value, then in step 860, the state machine waits for the next gain control value. After receiving the next gain control value, it is determined in step 865 whether the gain control values have changed (i.e., whether v1 is not equal to v2). If the gain control values have changed, then the calibration is complete and the state machine proceeds to step 870. If the gain control values have not changed, then the state machine proceeds to step 835.

It should be appreciated that the state machine described above is merely one example of a state machine suitable for determining a DAC code to compensate for an offset error. Other state machine designs may be suitable as well and the aspects of the invention are not limited in this respect. In addition, an offset signal generator need not be implemented using a state machine. Any hardware or software component capable of generating and modifying an offset signal to approximate an offset error may be used, as the aspects of the invention are not limited in this respect.

The above-described embodiments of the present invention can be implemented in any of numerous ways. For example, the embodiments may be implemented using hardware, software or a combination thereof. It should be appreciated that any component or collection of components that perform the functions described above can be generically considered as one or more controllers that control the above-discussed function. The one or more controller can be implemented in numerous ways, such as with dedicated hardware, circuitry or with general purpose hardware (e.g., one or more processor) that is programmed using microcode or software to perform the functions recited above.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. The invention is capable of other embodiments and of being practiced or of being carried out in various ways.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing", "involving", and variations thereof herein, is meant to encompass the items listed thereafter and equivalents thereof as well as additional items.

What is claimed is:

1. A calibration component configured to calibrate an automatic gain controller (AGC) of a tuner configured to isolate a selected channel from a multi-channel broadcast signal, the tuner implemented substantially on two chips, the calibration component comprising:
   a calibration signal generator implemented on a radio frequency (RF) integrated circuit on a first chip, the RF integrated circuit being adapted for RF channel selection processing of the broadcast signal, the calibration signal generator adapted to generate a generally known calibration signal;
   a power detector implemented on the RF integrated circuit and configured to detect, during calibration, at least one power characteristic of the calibration signal and to provide a power level signal indicative of the at least one detected power characteristic;
   a gain controller implemented on a digital integrated circuit on a second chip, the digital integrated circuit being adapted for digital channel selection processing of the broadcast signal, the gain controller adapted to generate at least one error signal based, at least in part, on a comparison between the power level signal provided by the power detector and a first reference signal;
   an offset signal generator implemented on the RF integrated circuit and configured to generate an offset signal based, at least in part, on the at least one error signal; and
   a summing element implemented on the RF integrated circuit and adapted to combine the offset signal with the power level signal provided by the power detector to provide an adjusted power level signal.

2. The calibration component of claim 1, wherein the calibration signal generator includes an oscillator.

3. The calibration component of claim 2, wherein the calibration signal generator includes a ring oscillator.

4. The calibration component of claim 1, wherein components of the calibration component form a control loop adapted to drive the at least one error signal to zero or substantially zero, the calibration component completing operation when the control loop has substantially converged.

5. The calibration component of claim 4, wherein the offset signal generator includes a digital-to-analog converter (DAC) configured to generate the offset signal from the DAC code representing a digital number that is modified during calibration based, at least in part, on the at least one error signal.

6. The calibration component of claim 5, wherein the offset signal generator includes a storage element to store a final DAC code for generating the offset signal when the control loop has converged.

7. The calibration component of claim 6, wherein the offset signal generator includes a finite state machine (FSM) adapted to modify the DAC code based, at least in part, on the at least one error signal.

8. The calibration component of claim 6 in combination with the AGC, the AGC comprising:
   a variable gain amplifier (VGA) implemented on the RF integrated circuit, the VGA adapted to receive the broadcast signal and to apply a variable gain to the broadcast signal based, at least in part, on a gain signal to provide an amplified broadcast signal;
   the power detector configured, after calibration, to detect at least one power characteristic of the amplified broadcast signal and to provide a power level signal indicative of the at least one detected power characteristics;
   the summing element configured to combine the offset signal generated from the final DAC code to provide the adjusted power level signal; and
   the gain controller adapted to generate at least one error signal based, at least in part, on a comparison between the adjusted power level signal provided by the power detector and a second reference signal, wherein the gain signal is based, at least in part, on the at least one error signal generated by the gain controller.

9. The combination of claim 8, further comprising a gain mapper configured to map the integrated error signal to the gain signal.

10. The combination of claim 9, wherein the gain mapper is implemented on the RF integrated circuit.

11. The combination of claim 9, wherein the gain mapper is implemented on the digital integrated circuit.

12. The combination of claim 11, wherein the first reference signal and the second reference signal are the same.

13. The calibration component of claim 1, further comprising an analog-to-digital converter (ADC) arranged between the power detector and the gain controller to convert the power level signal to a digital power level signal for digital processing by the gain controller.

14. The calibration component of claim 13, wherein the ADC is implemented on the digital integrated circuit.

15. The calibration component of claim 13, wherein the ADC is implemented on the RF integrated circuit.

16. The calibration component of claim 13, wherein the gain controller includes a summation element to generate a first error signal based on a difference between the reference signal and the digital power level signal.

17. The calibration component of claim 13, wherein the gain controller includes an integrator to integrate the first error signal to provide an integrated error signal.

18. An automatic gain controller (AGC) for use in a tuner adapted to isolate a selected channel from a multi-channel broadcast signal, the AGC configured to operate in a calibration mode adapted to calibrate the AGC, and an operation mode adapted to apply a variable gain to a broadcast signal, the AGC comprising:
   a first control loop comprising:
      a calibration signal generator adapted to generate a calibration signal;
      a power detector configured to detect at least one power characteristic of a received input signal and to provide a power level signal indicative of the at least one detected power characteristic;
      a summing element to combine the power level signal with an offset signal to provide an adjusted power level signal;
      a gain controller including a reference signal, the gain controller adapted to generate at least one error signal indicative of a difference between the reference signal and the adjusted power level signal; and
      an offset signal generator adapted to provide the offset signal to the summing element, the offset signal generator configured to adjust the offset signal during the calibration mode based, at least in part, on the at least one error signal; and
   a second control loop comprising:
      a variable gain amplifier (VGA) adapted to receive the broadcast signal and to apply a variable gain to the broadcast signal based on a gain signal to provide an amplified broadcast signal;
      the power detector;
      the summing element; and
      the gain controller,
   wherein, in the calibration mode, the first control loop is operational and the received input signal to the power detector is the calibration signal, the first control loop operating to modify the offset signal such that it reflects an offset error of the AGC, and wherein, in the operation mode, the second control loop is operational and the received input signal to the power detector is the amplified broadcast signal, the second control loop operating to maintain a power level of the amplified broadcast signal within a desired range.

19. The AGC of claim 18, wherein the AGC is adapted for use with a tuner implemented substantially on two chips, a first chip comprising a radio frequency (RF) integrated circuit adapted for RF processing and a second chip comprising a digital integrated circuit adapted for digital processing, and wherein the VGA, the calibration signal generator, the power detector and the offset signal generator are implemented on the RF integrated circuit, and wherein the gain controller is implemented on the digital integrated circuit.

20. The AGC of claim 18, wherein the offset signal generator comprises:
   a state machine configured to map the error signal into a digital-to-analog converter (DAC) code indicating the value of the offset signal; and
   a DAC configured to convert the DAC code into the offset signal.

21. The AGC of claim 18, further comprising a multiplexer arranged to receive the calibration signal and the amplified broadcast signal, the multiplexer adapted to provide the calibration signal to the power detector when in the calibration mode and to provide the amplified broadcast signal to the power detector when in the operation mode.

22. The AGC of claim 21, wherein the AGC is automatically set to the calibration mode upon power-up of the AGC.

23. The AGC of claim 22, wherein the AGC is in operation mode after the calibration process is completed.

24. The AGC of claim 21, wherein the gain controller includes a integrator to integrate the first error signal to provide an integrated error signal.

25. The AGC of claim 24, further comprising a gain mapper configured to map the integrated error signal to the gain signal.

26. The AGC of claim 25, wherein the gain mapper is implemented on the RF integrated circuit.

27. The AGC of claim 25, wherein the gain mapper is implemented on the digital integrated circuit.

28. A method of calibrating an automatic gain controller (AGC) for use in a tuner configured to isolate a selected channel from a multi-channel broadcast signal, the tuner implemented substantially on two chips, the method comprising:

generating a generally known calibration signal on a radio frequency (RF) integrated circuit on a first chip, the RF integrated circuit being adapted for RF channel selection processing of the broadcast signal;

detecting, on the RF integrated circuit, at least one power characteristic of the calibration signal;

providing, on the RF integrated circuit, a first power level signal indicative of the at least one power characteristic of the calibration signal;

receiving the first power level signal on a digital integrated circuit on a second chip, the digital integrated circuit being adapted for digital channel selection processing of the broadcast signal;

generating, on the digital integrated circuit, a first error signal based, at least in part, on a comparison between the first power level signal and a first reference signal;

generating an offset signal based, at least in part, on the first error signal; and combining the offset signal with the first power level signal provided by the power detector to provide an adjusted first power level signal.

29. The method of claim 28, wherein generating the calibration signal includes generating the generally known calibration signal using an oscillator.

30. The method of claim 29, wherein generating the calibration signal includes generating the generally known calibration signal using a ring oscillator.

31. The method of claim 28, wherein acts in the calibration method are repeated on the adjusted first power level signal until the first error signal is zero or substantially zero, or is determined to be sufficiently small, thereby indicating that the calibration is completed.

32. The method of claim 31, wherein a representation of the offset signal generated when the calibration is completed is stored for use in compensating for at least an offset error during operation of the AGC.

33. The method of claim 28, further comprising converting the adjusted first power level signal to a first digital power level signal for digital processing on the digital integrated circuit.

34. The method of claim 33, wherein converting the first power level signal is performed on the digital integrated circuit.

35. The method of claim 33, wherein converting the first power level signal is performed on the RF integrated circuit.

36. The method of claim 33, wherein generating the first error signal includes determining a difference between the reference signal and the first digital power level signal.

37. The method of claim 28, further comprising operating the AGC subsequent to completing calibration, operating the AGC comprising:

applying, on the RF integrated circuit, a variable gain to the broadcast signal based, at least in part, on a gain signal to provide an amplified broadcast signal;

detecting, on the RF integrated circuit, at least one power characteristic of the amplified broadcast signal;

providing, on the RF integrated circuit, a second power level signal indicative of the at least one power characteristic;

adjusting the second power level signal according to the stored offset signal to provide an adjusted second power level signal;

receiving, on the digital integrated circuit, the adjusted second power level signal;

generating, on the digital integrated circuit, a second error signal based, at least in part, on a comparison between the adjusted second power level signal and a reference signal; and providing, on the RF integrated circuit, the gain signal based, at least in part, on the second error signal.

* * * * *

UNITED STATES PATENT AND TRADEMARK OFFICE
CERTIFICATE OF CORRECTION

| | | |
|---|---|---|
| PATENT NO. | : 7,853,229 B2 | Page 1 of 1 |
| APPLICATION NO. | : 11/890858 | |
| DATED | : December 14, 2010 | |
| INVENTOR(S) | : Prabir C. Maulik et al. | |

It is certified that error appears in the above-identified patent and that said Letters Patent is hereby corrected as shown below:

At column 17, line 52, in Claim 17, please change "claim 13," to --claim 16,-- therefor.

Signed and Sealed this
Fourteenth Day of June, 2011

David J. Kappos
*Director of the United States Patent and Trademark Office*